United States Patent [19]
Dell et al.

[11] Patent Number: 6,118,719
[45] Date of Patent: Sep. 12, 2000

[54] SELF-INITIATED SELF-REFRESH MODE FOR MEMORY MODULES

[75] Inventors: Timothy J. Dell, Colchester; Bruce G. Hazelzet; Mark W. Kellogg, both of Essex Junction, all of Vt.

[73] Assignee: International Business Machines Corporation, Armonk, N.Y.

[21] Appl. No.: 09/081,639

[22] Filed: May 20, 1998

[51] Int. Cl.[7] .................................................. G11C 7/00
[52] U.S. Cl. ............................ 365/222; 365/233; 365/239
[58] Field of Search ..................... 711/106, 170; 365/201, 222, 191, 233, 239

[56] References Cited

U.S. PATENT DOCUMENTS

| | | | |
|---|---|---|---|
| 4,185,323 | 1/1980 | Johnson et al. | 365/222 |
| 4,710,903 | 12/1987 | Hereth et al. | 365/194 |
| 5,148,546 | 9/1992 | Blodgett | 395/750 |
| 5,208,779 | 5/1993 | Walther et al. | 365/222 |
| 5,247,655 | 9/1993 | Khan et al. | 395/550 |
| 5,262,998 | 11/1993 | Mnich et al. | 365/222 |
| 5,446,695 | 8/1995 | Douse et al. | 365/222 |
| 5,469,559 | 11/1995 | Parks et al. | 395/433 |
| 5,475,645 | 12/1995 | Wada | 365/222 |
| 5,485,625 | 1/1996 | Gumkowski | 395/800 |
| 5,557,577 | 9/1996 | Kelly | 365/222 |
| 5,617,551 | 4/1997 | Corder | 395/401 |
| 5,802,555 | 9/1998 | Shigeeda | 711/106 |

*Primary Examiner*—David Nelms
*Assistant Examiner*—Thong Le
*Attorney, Agent, or Firm*—William N. Hogg; Robert A. Walsh

[57] ABSTRACT

A method and apparatus for selectively causing each bank of a number of banks of DRAMs of a DRAM memory card to enter into the self-refresh mode without affecting the operation of any other bank. In the computer system incorporating the SIMM or DIMM type DRAM cards, each bank of memory on each card has a RAS signal specific to that specific bank. One or more CAS signals are supplied across all of the memory banks, on all cards. Thus, each memory bank is accessed separately for a read/write operation by the RAS becoming active before the CAS becomes active; and refresh takes place by the CAS signal becoming active before the RAS signal becomes active. The number of clock cycles or refresh cycles between active RAS signals to each memory bank are counted. If RAS does not become active for N clock or refresh cycles, a signal is provided within each respective memory bank and that memory bank will immediately, or preferably after M additional clock or refresh cycles enter self-refresh mode without affecting the operation of any other bank. At the same time, the memory controller counts cycles of RAS inactivity for each DRAM bank it controls. A signal is also provided to a register to require a double read/write on the next active read/write cycle to that bank, for reactivating that bank from the self-refresh mode when RAS signal specific to that bank becomes active while CAS is inactive.

26 Claims, 3 Drawing Sheets

SELF-INITIATED SELF-REFRESH MODE FOR MEMORY MODULES

BACKGROUND OF THE INVENTION

This invention relates generally to a technique for entering or leaving self-initiated self-refresh or "sleep" mode for memory modules, and more particularly to a method and structure for causing individual banks of chips in memory modules to enter the self-refresh mode based on predetermined intervals of non-use in read/write operations for that particular bank.

BACKGROUND INFORMATION

As the amount of computer memory available on personal computers, and especially portables or lap-top computers, increases, the amount of power required to maintain the memory in an active state increases. Hence, it has become conventional practice to reduce the power used by the chips in the various memory banks of SIMMs and DIMMs when they are not in use by having the chips, or banks of chips enter a self-refresh mode in which power requirements are substantially decreased. In fact, power savings can be realized if individual banks of memory on SIMM and DIMM cards wherein there is more than one bank of DRAM memory can be placed into self-refresh mode while the other bank(s) on the card continues to be maintained in an active mode for read/write operations. One conventional prior art technique of sending memory on a SIMM or DIMM card into self-refresh modes includes a provision of a real time, system clock on board, and when a certain period of time has passed without activity the clock will, at the end of a preselected clock time, put the entire SIMM or DIMM into self-refresh mode. However, this technique requires that all of the banks of memory be inoperative during the clock time during which self-refresh is being entered, which time can be as long as several hundred microseconds.

It is therefore a principle object of this invention to provide a method and apparatus for sending individual physical banks of DRAM chips into self-refresh mode after a predetermined interval of non-use without the necessity of each of the other banks being inoperative during any period of time during which the self-refresh mode is being entered by any other particular bank.

SUMMARY OF THE INVENTION

According to the present invention, a method and apparatus is provided for selectively deactivating each bank of a number of banks of memory on a memory card by determining the interval between successive read/write cycles, deactivating each bank when the interval exceeds a given value, and reactivating the bank upon the next read/write cycle when the memory bank is inactive. In one embodiment the invention is specific to selectivity causing each bank of a number of banks of DRAMs of a DRAM memory card to enter into the self-refresh mode without affecting the operation of any other bank. In a typical computer system incorporating the SIMM or DIMM type DRAM cards, each of the banks of memory on each card is provided with a RAS signal specific to that specific bank. One or more CAS signals are supplied across all of the memory banks, on all cards. Thus, each of the memory banks is activated separately for a read/write operation in a conventional way by the RAS signal becoming active before the CAS signal becomes active; and refresh takes place by the CAS signal becoming active before the RAS signal becomes active (known as CAS before RAS or CBR refresh).

The technique of this invention includes counting of the number of clock cycles or refresh cycles between active RAS signals to each individual memory bank. If RAS does not become active for a given number N of clock or refresh cycles, a signal is internally provided to each respective memory bank and that memory bank will immediately, or preferably after a given number M of additional clock or refresh cycles enter self-refresh mode without affecting the operation of any other banks on the card. At the same time, the memory controller is counting cycles of RAS inactivity for each bank of DRAM it controls. A signal is also provided to a register which will then require a double read/write on the next active read/write cycle to that bank, for reactivating each of said banks from the self-refresh mode when RAS signal specific to that bank becomes active while CAS is inactive. The bank of DRAM is returned to active state when RAS becomes active while CAS is still inactive.

DESCRIPTION OF THE PREFERRED EMBODIMENT(S)

Figure 1:
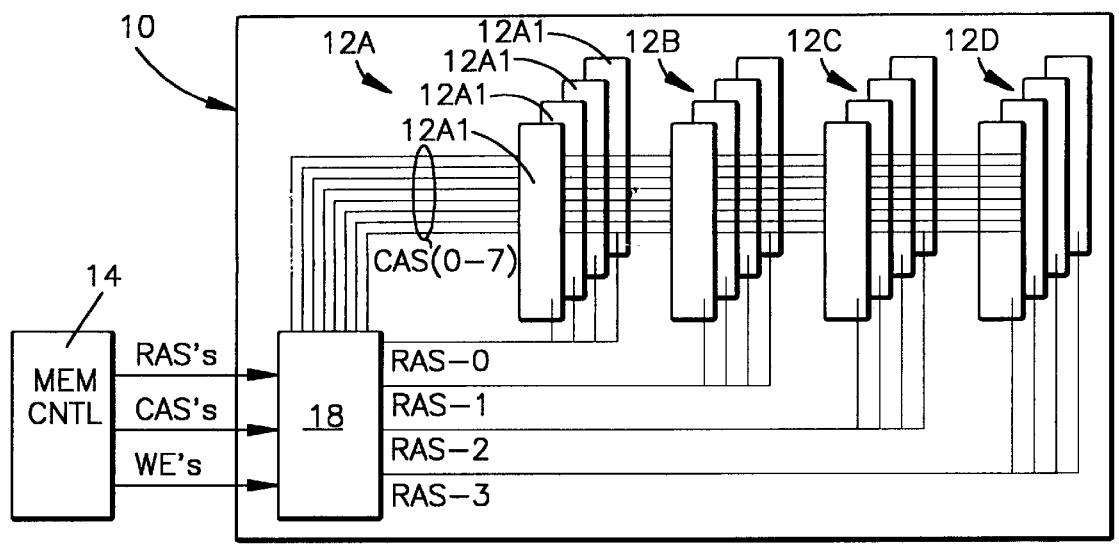
FIG. 1 is a diagrammatic representation of a computer system with a DRAM card having a memory controller and a plurality of banks of DRAM chips on the DRAM card.

Referring now to the drawings and to the present FIG. 1, an asynchronous DRAM card is shown somewhat diagrammatically and designated by the reference character 10. Conventionally, in certain configurations, a DRAM card has a plurality of banks of DRAM (Dynamic Random Access Memory) chips, four of which banks are shown and designated as 12a, 12b, 12c and 12d. Each bank 12a, 12b, 12c, and 12d is made up of a number of DRAM chips, the number of chips being dependent upon the bus size and the type of chip. For illustration purposes, but not by way of limitation, each bank is shown with four chips, 12a1, 12a2, 12a3, and 12a4; 12b1, 12b2, 12b3, and 12b4; 12c1, 12c2, 12c3, and 12c4; and 12d1, 12d2, 12d3, and 12d4. This represents a chip configuration in each bank of four x16 DRAM chips. Other possible arrangements of chip configurations include two x32 DRAM chips or eight x8 DRAM chips or 16×4 DRAM chips. These are typical configurations for 64 bit wide data busses.

The DRAM card 10 is located in a computer 16 which is provided with a memory controller 14 which controls the DRAMs 12 on the card 10 by use of RAS, (row activation stroke) CAS (column activation stroke) and WE (write enable) signals supplied from the memory controller 14 through a distribution network 18. Specifically, the memory controller 14 provides RAS and CAS and WE signals formatted as one RAS per bank, one CAS per byte, and one WE per memory subsystem. In the case where there are four banks, there will be four RAS signals, RAS0, RAS1, RAS2 and RAS3; RAS0 is delivered to each of the four DRAMs in bank 12a, RAS1 is delivered to each of the chips in DRAM bank 12b, RAS2 is delivered to each of the chips in the DRAM bank 12c, and RAS3 is delivered to each of the chips in the DRAM bank 12d. In the case where an 8-byte (64 bit) data bus is used, the memory controller also provides eight CAS signals, CAS0 through CAS7, which signals are common to all of the memory banks 12a, 12b, 12c, and 12d. A single WE supplies all DRAMs. In operation, a read/write operation to any of the banks is performed if RAS goes active before CAS goes active and a WE signal is supplied either active for a write operation, or inactive for a read operation. A refresh operation is performed if CAS goes active before RAS (CBR refresh), and WE is held inactive.

In order to conserve power, if the memory has not been used for read/write operations over a given period of time, it is conventional practice for the system to cause memory to enter the self-refresh mode, which is a reduced power demand mode, and the memory is left in the self-refresh mode until a read/write operation is again required based on a read/write signal from the system, or some external event, such as opening the lid on a laptop. (The self-refresh mode is sometimes referred to as the "sleep mode".) At this time, the memory is again made to be in the active mode. (This active mode is sometimes referred to as the "awake mode".)

The present invention provides the capability of sending each bank of DRAMs 12a, 12b, 12c, and 12d into the self-refresh mode individually without affecting the operation of the other banks of DRAMs and to revive each bank individually to the active mode.

Figure 2:
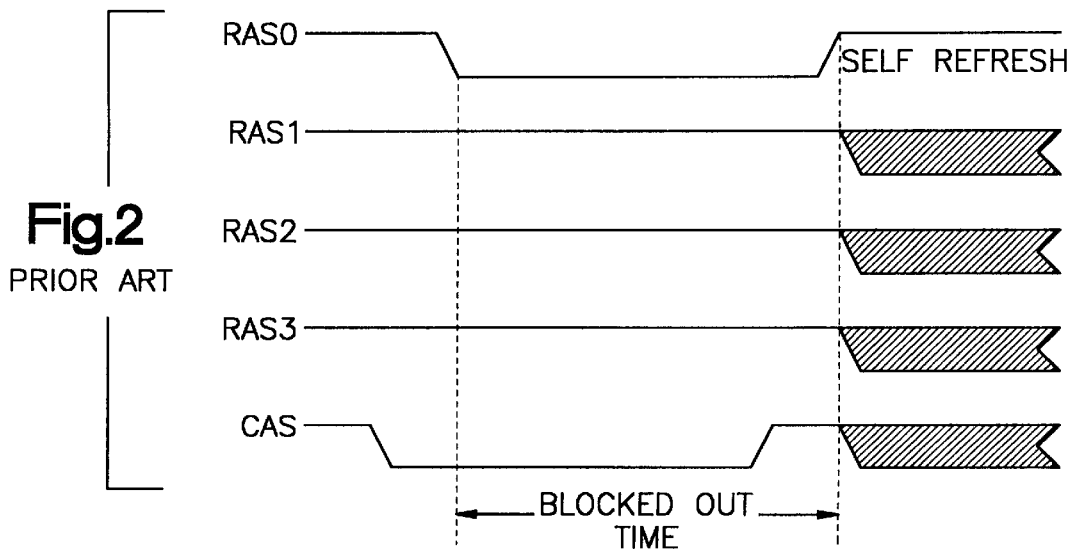
FIG. 2 is a signal diagram of a prior art technique of entering banks of DRAMs into self-refresh mode.

The prior art technique to initiate self-refresh mode for any individual bank is illustrated by the signal diagram shown in FIG. 2. As can be seen in FIG. 2, the entering of a bank on conventional self-refresh mode operation relies on a CAS before RAS condition, i.e. the CAS becoming inactive before RAS as a trigger or a flag for memory modules to enter the self-refresh mode of operation. Specifically, according to one prior art technique, the CAS and RAS must both be inactive for 100 plus microseconds to trigger the self-refresh mode. Thus, the CAS being common to all of the banks, all of four banks 12a, 12b, 12c and 12d must be idle for the 100 plus microseconds to trigger the self-refresh mode. This is because CAS being active to allow self-refresh to be initiated in one bank also causes any operation to another bank to look like a CBR refresh—due to the fact that the CAS's go to all banks and are already active putting the first bank to sleep.

Figure 3:
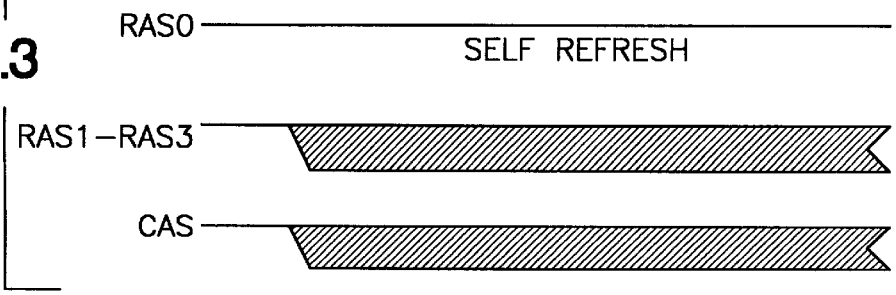
FIG. 3 is a signal diagram of the present invention entering a bank of DRAMs on a card into self-refresh mode.

The present invention as depicted in FIG. 3 provides a method wherein the individual memory banks can initiate self-refresh mode without affecting the operation of any of the other banks. As shown in FIG. 3, a new method of initiating sleep mode is provided. Each bank 12a, 12b, 12c, and 12d can be put into self-refresh mode individually while allowing the other banks to continue to operate in a conventional manner.

Figure 4:
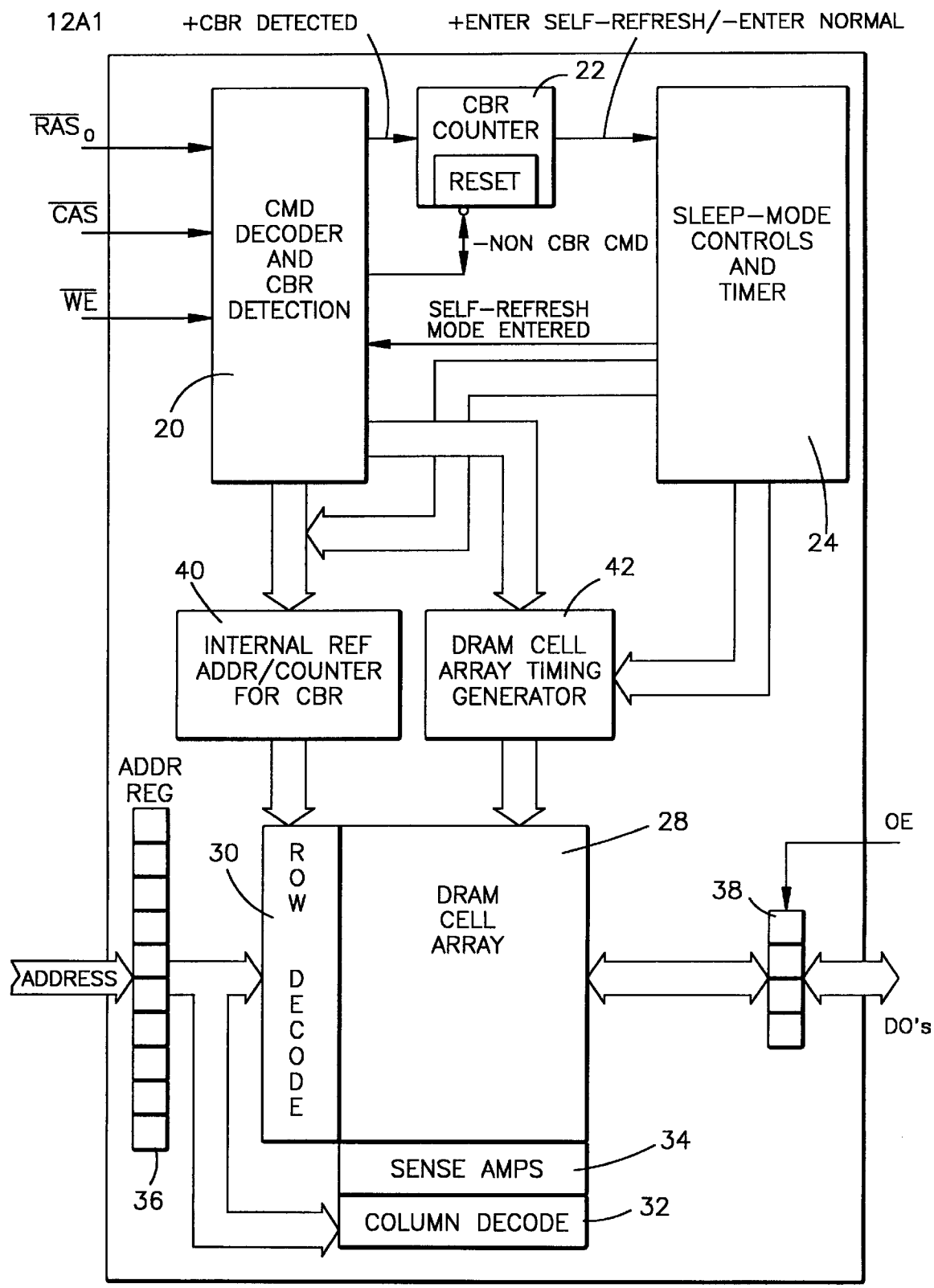
FIG. 4 is a block diagram of the circuitry of the device of the present invention for entering a DRAM device into and taking it out of self-refresh mode.

The block diagram of the circuitry which provides for this is shown in FIG. 4, which depicts the controls on each chip 12a1, 12a2, 12a3, 12a4; 12b1, 12b2, 12b3, 12b4; 12c1, 12c2, 12c3, 12c4; and 12d1, 12d2, 12d3, 12d4 in a bank, it being understood that each chip in each bank has similar controls. As shown in FIG. 4, each of the banks has a command (CMD) decoder and CAS before RAS (CBR) detector 20. A CBR condition is outputted to a CBR counter 22 which counts the number of refresh cycles, and, after a given number N of refresh cycles, outputs a signal to self-refresh controls 24 to enter the self-refresh mode.

The DRAM chip also includes a DRAM cell array 28, which includes a row decoder 30, a column decoder 32 and sense amps 34. An address register 36 is provided which receives the addresses from the computer system 16, and provides the addresses to the row decoder 30 and the column decoder 32. The output from the DRAM cell array 28 is provided to an output register 32. The command decoder and CBR detector 20 also provides an output signal to internal CBR refresh address register 40 and a DRAM cell and timing generator 42. (Note that in the prior art, rather than a CBR counter 22 an inaccurate, real-time clock is used to determine the ≈100 μs required for sleep mode entry.)

The circuitry depicted in FIG. 4 acts generally as follows: The command decoder and CBR detector 20 receives the RAS signal from the computer for the particular bank, which in the depicted example in FIG. 4 is RAS0, and also receives CAS and WE signals. The command decoder and CBR detector 20 outputs a signal in a conventional manner to the DRAM cell and timing generator 42 for operation of the DRAM cell array 28 responsive to the conventional RAS before CAS signals received at the command decoder and CBR detector 20, and an address received at the address register 36, to output valid data to the data register 38. This is a conventional function and need not be described in any more detail.

Additionally, the command decoder and CBR detector 20 outputs a signal to the internal refresh address for the CBR 40 when the DRAM device has been put into a conventional CBR refresh cycle. Also, as explained previously, self-refresh mode is entered when the system sends a CAS before RAS signal and both CAS and RAS remain low for a given period of time, typically 10 to 100 microseconds. When this happens and the system goes into self-refresh, the internal refresh addresses are used from the counter 40 and are updated under control of the sleep mode controls timer unit 24. This can occur, for example, when the top of a lap-top computer is closed or if the laptop has been idle for some time.

According to the present invention, however, circuitry allows each of the banks to be put into self-refresh mode independently of any of the other banks, thus contributing to the conservation of power while the computer is still in an operating mode. This is accomplished by the CBR counter 22 counting the number of CBR cycles received with no intervening operations, i.e., reads or writes. If the number of CBR refreshes exceeds a given number N then the CBR counter outputs a signal to the sleep mode control and timer 24 which initiates a self-refresh mode entry to conserve power. This causes the internal refresh and timing circuitry to work at low power in a well known conventional manner, with the exception that the RAS and CAS receivers are not powered down. (Typically, only the RAS receiver stays active.)

The DRAM device 12a1 will remain in the self-refresh mode on a reduced power scale until a "wake-up" call comes. The wake-up call, according to the present invention, is when a RAS before CAS signal, indicating a read/write operation, is generated by the memory controller. These signals are then processed in the command decoder and CBR detector 20, which causes the CBR counter 22 to be reset, sending a control signal to the sleep mode control and timer 24, which in turn sends a signal to the command decoder and CBR detector 20 indicating that the DRAM cell array has gone out of refresh mode and into active or read/write mode. The memory controller then, after a conventional cycle time has passed, reissues the read/write command which the now fully awake DRAM device 12a1 is able to process normally.

The CBR counter keeps counting refreshes, and each time there is a RAS before CAS decoded by the decoder 20 it resets the CBR counter 22 since a RAS before CAS indicates a valid read/write signal.

Figures 5, 6:
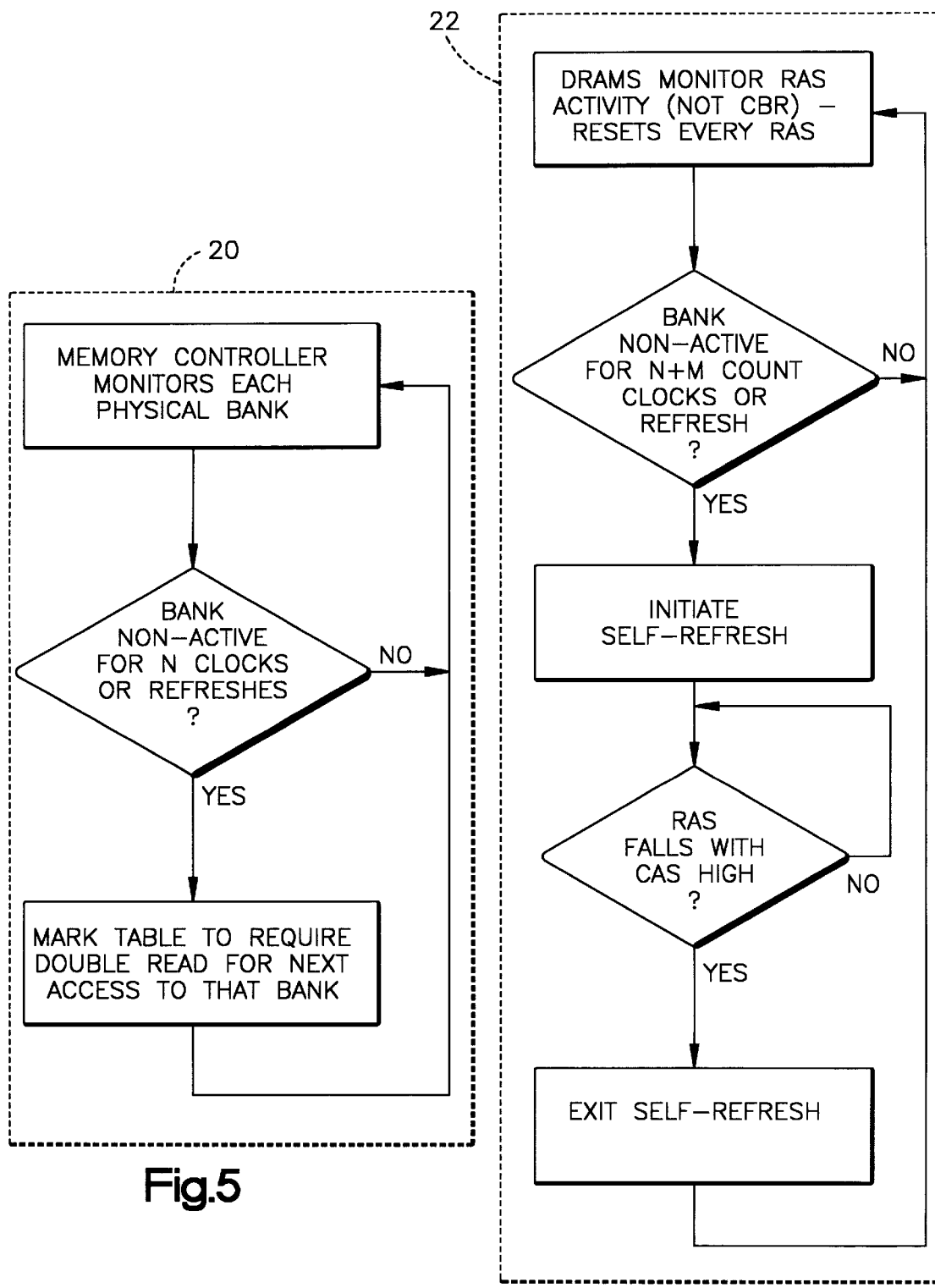
FIG. 5 is a flow chart of the relevent logic of the memory controller of the present invention.
FIG. 6 is a flow chart of the relevent logic of the DRAM of the present invention.

The logic of the CMD decoder and the CBR detector 20 is shown in FIG. 6 as a state machine flow chart. FIG. 5, is a corresponding state machine flow chart of the logic of the sleep mode controls in the memory controller.

Referring now to FIG. 5, a memory controller monitors each physical bank of memory for read/write activity and on a per bank basis counts the number of refreshes that have occurred without any intervening read/write activity. When a bank remains non-active for N refresh cycles, a table or register is marked to require a double read or write for the next access to the bank. This is because the controller knows that after N uninterrupted CBR refresh cycles, the DRAMs in any gives bank will automatically put themselves into sleep mode.

Referring now to FIG. 6, the DRAMs of the present invention will, at the same time as the memory controller of the present invention, also count CBR refreshes. If no intervening active read or write cycles occur, after the same N number of refreshes, plus a potential safety factor of M additional refreshes, sleep mode is entered. If an active cycle is detected, the device will exit self-refresh mode.

The count for the initiating the self-refresh is N+M counts, where M may be greater than or equal to zero, so as to ensure that the command decoder and CBR detector 20 has indeed executed and issued the command to go into self-refresh and it is not going to go into an active mode on the next clock cycle which potentially could cause confusion between going in and out of the self-refresh mode. However, M theoretically can be zero, and may so be if confusion is not an issue.

The number of refresh cycles N can vary, depending on the amount of time desired before the particular bank goes into self-refresh mode. For example, if the refresh rate is 15.6 μs, one might desire to have N equal to 10 refresh cycles and M equal to 1 refresh cycle which would give a period of time of 156 μs before marking the table to require a double read and N+M or 171.6 μs before putting a bank into self-refresh mode.

The CBR counter 22 also provides a signal to the sleep mode controls and timer 24. If the bank is non-active for N+M clock cycles, then a signal is sent to the CMD decoder 20 to initiate self-refresh mode. The CBR counter continues to monitor the clock cycles and active RAS signal. If, in the sleep mode, RAS falls with CAS high, signifying a normal, active operation, a signal is sent to the sleep mode controls and timer 24 and from sleep-mode controller and timer 24 to the CMD decoder and CBR detector 20 to exit self-refresh mode and start operating in the normal, active state.

Thus, each DRAM device bank 12a1, 12a2, 12a3, and 12a4; 12b1, 12b2, 12b3, and 12b4; 12c1, 12c2, 12c3, and 12c4; and 12d1, 12d2, 12d3, and 12d4 can be put into the self-refresh mode independently without the necessity of the entire card or memory being put into self-refresh mode and without the necessity of a delay of 10 to 100 microseconds in which the whole card or whole memory is inactive before any of the devices can be put into self-refresh mode.

Other embodiments for clocked DRAM devices, i.e., those DRAMs which receive a system clock signal to synchronize their activity, and especially their bus activity, can also be made. For example, in a synchronous DRAM (SDRAM) based system, system clock cycles could be counted instead of refresh cycles. This would provide a much finer time granularity because while the typical refresh rate is 15.6 ns, the typical system clock rate is 15 ns, moving down to 10 ns. Thus for a 100 MHz system (10 ns clock), the N and M of the example above becomes N=15,600 clock cycles and M=1,560 clock cycles to maintain the same total time intervals.

While the present invention has been illustrated by the description of the embodiments thereof, and while these embodiments have been described in considerable detail, it is not the invention to restrict or in any way limit the scope of the appended claims to such detail. Additional advantages and modifications may readily appear to those skilled in the art. Therefore, the invention, in its broadest aspects is not limited to the specific details, the representative apparatus, and illustrative examples shown and described. Accordingly, departures may be made from such details without departing from the spirit or scope of the applicant's general inventive concept.

What is claimed is:

1. A method of selectively deactivating from a high power state to a reduced power state each individual bank of memory in a computer system having a plurality of banks of memory, each bank of memory having at least one memory chip wherein each of said individual banks of memory is provided with at least one control signal specific thereto, and wherein each of said individual banks of memory is activated to said high power state for a read/write operation by the said at least one control signal, comprising the steps of:

determining the interval between successive read/write cycles to each respective individual bank of memory, deactivating said each respective individual bank of memory from said high power active state to said reduced power inactive state by circuitry within each memory chip in said respective individual bank of memory when the interval between successive read/write cycles to said each respective individual bank of memory is equal to or greater than a given value, and reactivating each respective individual bank of memory to the active high power state from the reduced power inactive state responsive to the first read/write cycle to each respective individual bank of memory when the respective individual bank of memory is in the inactive reduced power state.

2. The method as defined in claim 1 wherein the memory chips of each of said individual banks of memory are comprised of DRAM's.

3. The method as defined in claim 2 wherein there are system initiated refresh cycles performed on said each respective individual bank of memory at predetermined periods of time, and wherein said given value of the interval is measured by the number of refresh cycles between successive read/write cycles to each respective bank of memory.

4. The method of claim 3 wherein said at least one control signal includes a RAS signal and a CAS signal, and wherein said read/write cycle is initiated by a RAS before CAS signal sequence, and said system refresh is initiated by a CAS before RAS signal sequence.

5. The method as defined in claim 1 wherein a signal indicating the entrance into the inactive reduced power state of each respective individual bank of memory is supplied to a register at a given time respective to said given value.

6. The method as defined in claim 5 wherein said signal indicating entering the inactive reduced power state is given at a predetermined time period prior to the interval of said given value.

7. The method as defined in claim 1 wherein the memory chips of each of said individual banks of memory comprise clocked DRAMs, the computer system includes a system clock, and the interval of said given value is determined by the number of system clock cycles between successive read/write operations to each said respective individual bank of memory.

8. A computer system having a plurality of individual banks of memory, each bank of memory having at least one memory chip and first logic circuitry to provide each of said individual banks of memory with at least one control signal specific thereto, and wherein each of said individual banks of memory is activated to a high power state for a read/write operation by said at least one control signal, comprising:
   second logic circuitry in each memory chip in each individual bank of memory for:
   (a) determining the interval between successive read/write cycles to each respective individual bank of memory,
   (b) providing a signal to each respective individual bank of memory to become inactive at a reduced power state when the interval between successive read/write cycles for that individual bank of memory is equal to or greater than a given value, and
   (c) reactivating said respective individual bank of memory from the inactive reduced power state to the high power state responsive to the first read/write cycle to said each respective individual bank of memory when the each respective individual bank of memory is in the inactive reduced power state.

9. The computer system as defined in claim 8 wherein the memory chip of each of said individual banks of memory include DRAMs.

10. The computer system as defined in claim 9 wherein there are system initiated refresh cycles performed on each respective individual bank of memory at predetermined periods of time, and wherein said second logic circuitry determines said given value of the interval from the number of refresh cycles between successive read/write cycles to each respective individual bank of memory.

11. The computer system as defined in claim 10 wherein said at least one control signal includes a RAS signal and a CAS signal, and wherein said read/write cycle is initiated by a RAS before CAS signal sequence, and said system refresh is initiated by a CAS before RAS signal sequence.

12. The computer system as defined in claim 8 wherein said logic circuitry provides a signal indicating the entrance into the inactive reduced power state of a respective individual bank of memory to a register at a given time respective to the interval of said given value.

13. The compute system as defined in claim 12 wherein said signal indicating entering the inactive reduced power state is given at a predetermined time period prior to the interval of said given value.

14. The computer system as defined in claim 8 wherein the memory chips of each of said individual banks of memory comprise clocked DRAMs, the computer system also includes a system clock, and said second logic circuitry determines said given value by the number of system clock cycles between successive read/write operations to each said respective bank of memory.

15. A memory card having a plurality of individual banks thereon of memory each bank having at least one memory chip for use in a computer system having first logic circuitry to provide each of said memory banks with at least one control signal specific thereto, and wherein each of said memory banks is activated to a high power state for a read/write operation by said at least one control signal, said memory card comprising:
   second logic circuitry in each memory chip in each individual bank of memory for:
   (a) determining the interval between successive read/write cycles to each respective memory bank;
   (b) providing a signal to each respective memory bank to become inactive at a reduced power state when the interval between successive read/write cycles for that individual bank of memory is equal to or greater than a given value, and
   (c) reactivating said respective bank from the inactive reduced power state to the high power state responsive to the first read/write cycle to said respective individual bank of memory when the respective individual bank of memory is in the inactive reduced power state.

16. The memory card as defined in claim 15 wherein the memory chip in each of said individual banks of memory comprise DRAMs.

17. The memory card as defined in claim 16 wherein there are system initiated refresh cycles performed on each respective individual bank of memory at predetermined intervals, and wherein said second logic circuitry determines said given value of the interval from the number of refresh cycles between successive read/write cycles to each respective individual bank of memory.

18. The memory card as defined in claim 17 wherein said at least one control signal includes a RAS signal and a CAS signal, and wherein said read/write cycle is initiated by a RAS before CAS signal sequence, and said system refresh is initiated by a CAS before RAS signal sequence.

19. The memory card as defined in claim 15 wherein said logic circuitry provides a signal indicating the entrance into the inactive reduced power state of a respective individual bank of memory to a register at a given time respective to said given value.

20. The memory card as defined in claim 19 wherein said signal indicating entering the inactive reduced power state is given at a predetermined time period prior to said given value.

21. The memory card as defined in claim 15 wherein said memory chips in each individual bank of memory comprise clocked DRAMs, the computer also includes a system clock and said second logic circuitry determines said value by the number of system clock cycles between successive read/write operations to each respective memory bank.

22. A memory chip for use in a computer system wherein said memory chip is activated to a high power state for a read/write operation by at least one control signal, said memory storage device comprising:
   logic circuitry for:
   (a) determining the interval between successive read/write cycles to said memory chip,
   (b) providing a signal to said memory chip to become inactive at a reduced power state when the interval between successive read/write cycles is equal to or greater than a given value, and
   (c) reactivating said memory chip to said high power state from the inactive reduced power state responsive to the first read/write cycle to said memory chip when the said memory chip is in the inactive reduced power state.

23. The memory chip as defined in claim 22 wherein said memory chip is a DRAM.

24. The memory chip as defined in claim 23 wherein there are system initiated refresh cycles performed on said device at predetermined intervals, and wherein said logic circuitry determines said given value of the interval from the number of refresh cycles between successive read/write cycles to said memory chip.

25. The memory chip as defined in claim 24 wherein said at least one control signal includes a RAS signal and a CAS signal, and wherein said read/write cycle is initiated by a RAS before CAS signal sequence, and said system refresh is initiated by a CAS before RAS signal sequence.

26. The memory chip as defined in claim 22 wherein said memory chip comprise clocked DRAMs, the computer also includes a system clock and said second logic circuitry determines said value by the number of system clock cycles between successive read/write operations to said memory chips.

* * * * *